US012610594B2

(12) United States Patent

Sugawara et al.

(10) Patent No.: US 12,610,594 B2

(45) Date of Patent: Apr. 21, 2026

(54) SEMICONDUCTOR DEVICE AND POWER CONVERSION APPARATUS

(71) Applicant: Mitsubishi Electric Corporation, Tokyo (JP)

(72) Inventors: Katsutoshi Sugawara, Tokyo (JP); Yutaka Fukui, Tokyo (JP); Kohei Adachi, Tokyo (JP); Kazuya Ishibashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 377 days.

(21) Appl. No.: 18/298,765

(22) Filed: Apr. 11, 2023

(65) Prior Publication Data

US 2023/0411448 A1 Dec. 21, 2023

(30) Foreign Application Priority Data

Jun. 15, 2022 (JP) ................................. 2022-096367

(51) Int. Cl.
H10D 62/10 (2025.01)
H02P 27/08 (2006.01)
(Continued)

(52) U.S. Cl.
CPC ......... H10D 62/111 (2025.01); H10D 30/668 (2025.01); H10D 62/393 (2025.01); H10D 62/8325 (2025.01); *H02P 27/08* (2013.01)

(58) Field of Classification Search
CPC ............. H10D 12/481; H10D 30/0297; H10D 30/668; H10D 62/107; H10D 62/111; H10D 62/127; H10D 62/393; H10D 62/8325
See application file for complete search history.

(56) References Cited

U.S. PATENT DOCUMENTS

| | | |
|---|---|---|
| 2005/0006717 A1 | 1/2005 | Yamaguchi et al. |
| 2006/0138407 A1 | 6/2006 | Yamaguchi et al. |
| (Continued) | | |

FOREIGN PATENT DOCUMENTS

| | | |
|---|---|---|
| JP | 2005-019528 A | 1/2005 |
| JP | 2008-066708 A | 3/2008 |
| (Continued) | | |

OTHER PUBLICATIONS

An Office Action; "Notice of Reasons for Refusal," mailed by the Japanese Patent Office on Jun. 17, 2025, which corresponds to Japanese Patent Application No. 2022-096367 and is related to U.S. Appl. No. 18/298,765; with English language translation.

*Primary Examiner* — Fazli Erdem

(74) *Attorney, Agent, or Firm* — Studebaker Brackett PLLC

(57) ABSTRACT

A semiconductor device includes a plurality of trenches penetrating through a source region and a base region, and a mesa region as a region between two of the plurality of trenches. A gate electrode that faces the base region with a gate insulating film interposed between the gate electrode and the base region is formed in each trench. An electric field relieving layer is provided immediately below each trench. A super junction structure in which a first pillar layer and a second pillar layer are alternately arranged is formed between the base region and the drift layer. A width of the first pillar layer is equal to or less than a width of the electric field relieving layer.

18 Claims, 4 Drawing Sheets

(51) Int. Cl.
    *H10D 30/66*        (2025.01)
    *H10D 62/17*        (2025.01)
    *H10D 62/832*      (2025.01)

(56)            References Cited

U.S. PATENT DOCUMENTS

| | | |
|---|---|---|
| 2008/0035992 A1 | 2/2008 | Kawaguchi et al. |
| 2008/0135930 A1 | 6/2008 | Saito |
| 2020/0035791 A1* | 1/2020 | Oshima .............. H10D 62/8325 |
| 2021/0036116 A1* | 2/2021 | Kyogoku ............. H10D 62/107 |
| 2021/0167167 A1 | 6/2021 | Kawada |
| 2021/0183995 A1 | 6/2021 | Kobayashi et al. |

FOREIGN PATENT DOCUMENTS

| | | |
|---|---|---|
| JP | 2008-124346 A | 5/2008 |
| JP | 2020-123607 A | 8/2020 |
| JP | 2021-027138 A | 2/2021 |
| JP | 2021-089916 A | 6/2021 |
| WO | 2019/009091 A1 | 1/2019 |
| WO | 2020/110514 A1 | 6/2020 |

* cited by examiner

F I G. 1
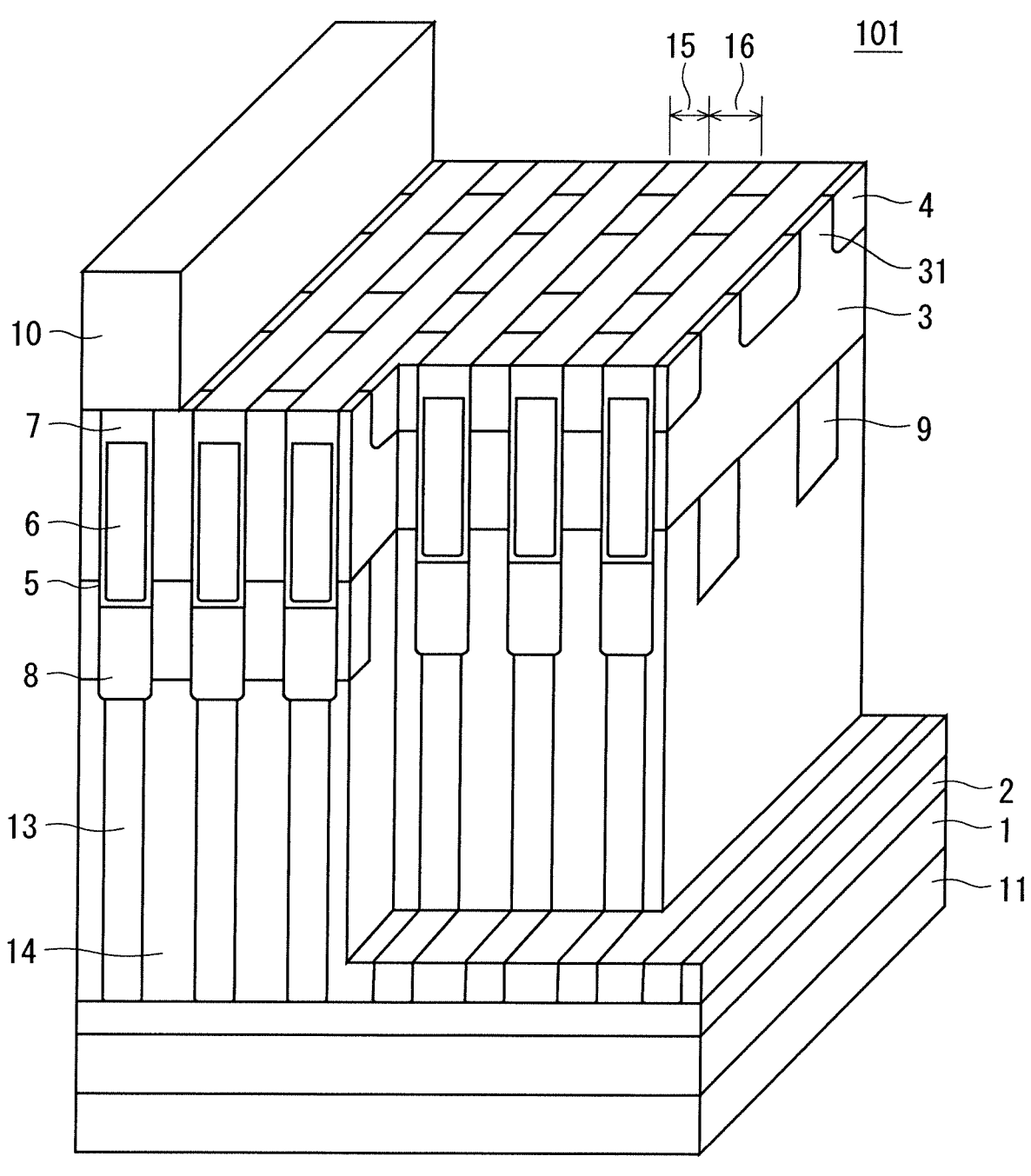

F I G.  2
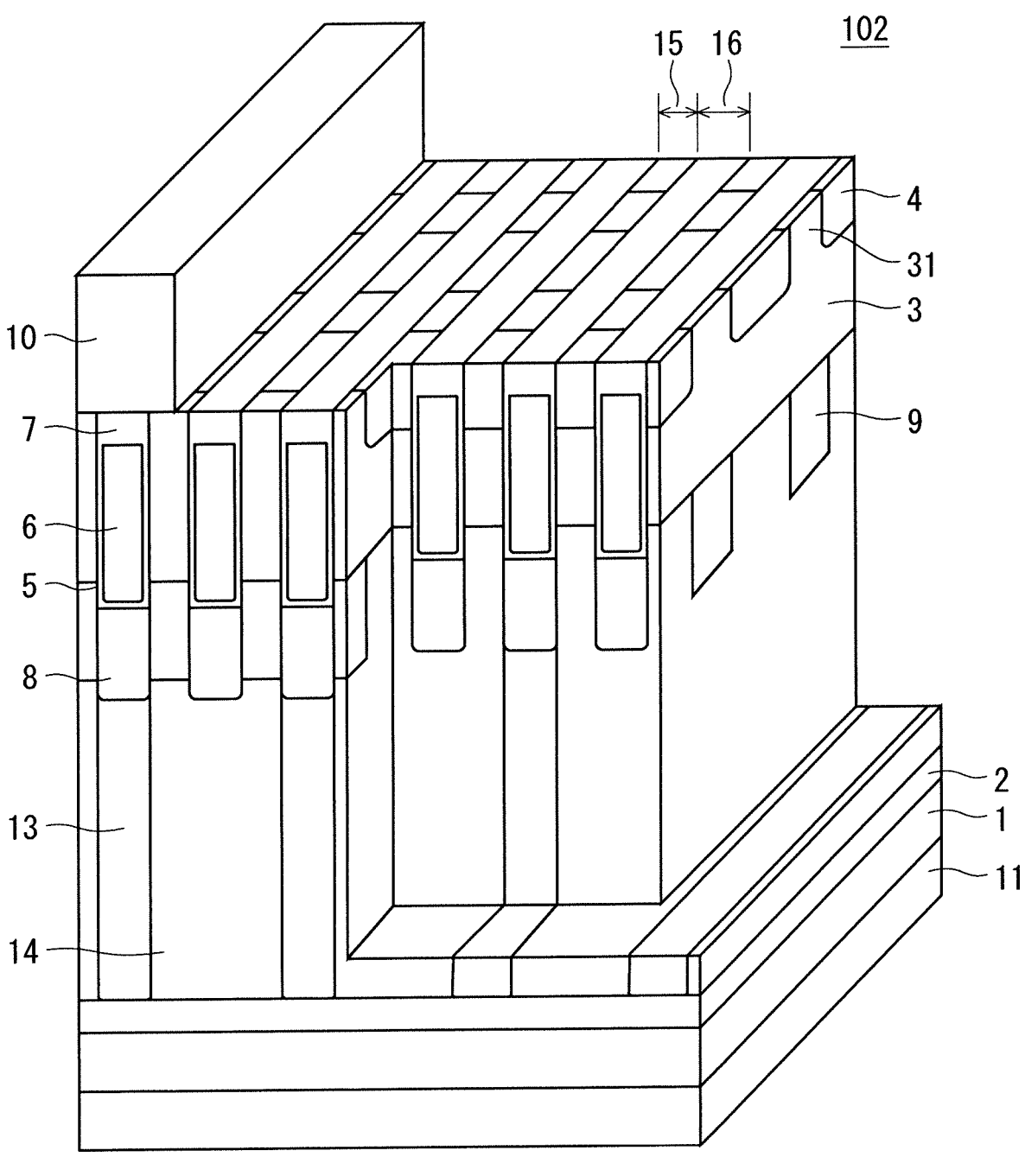

F I G. 3
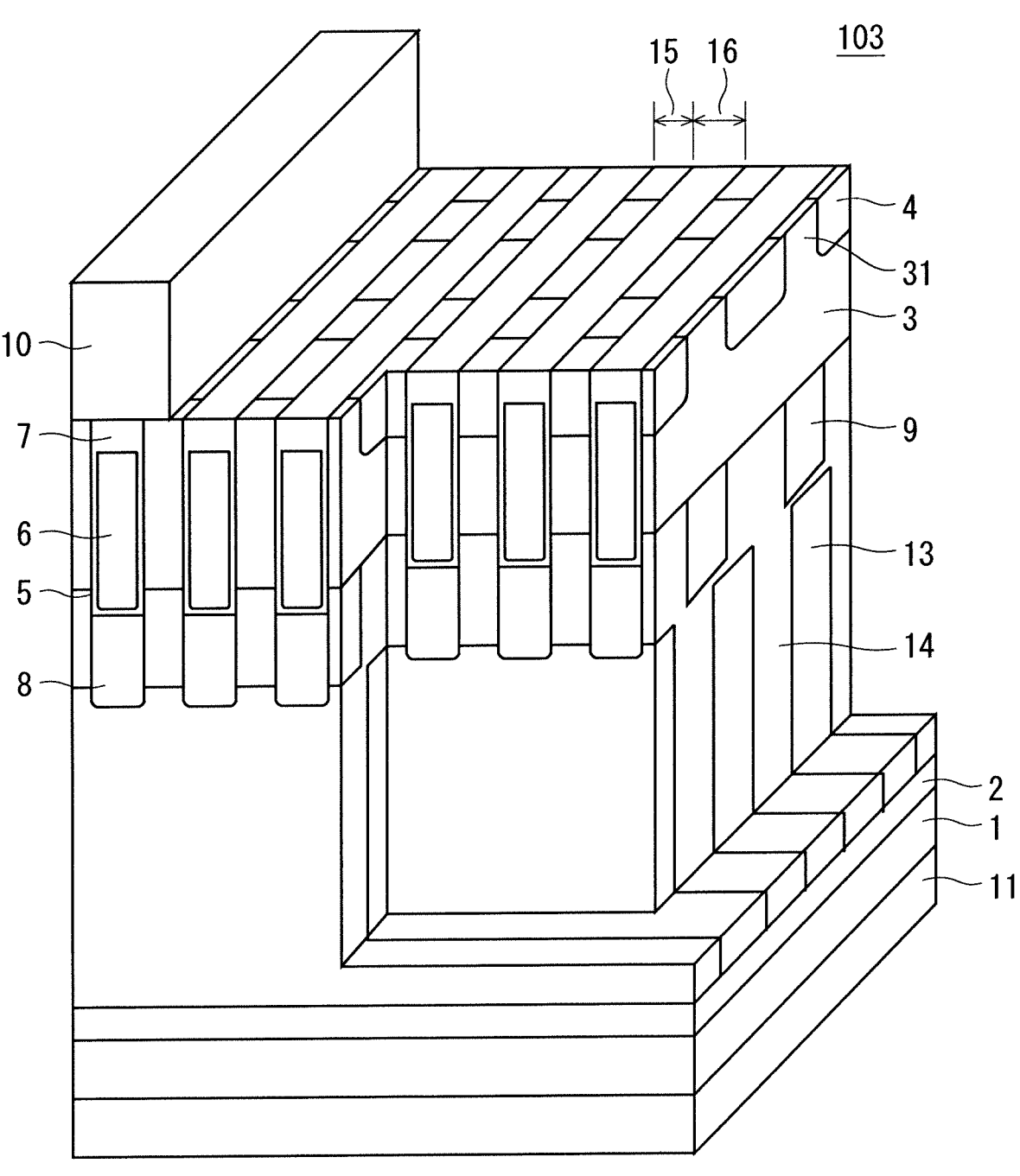

F I G .  4
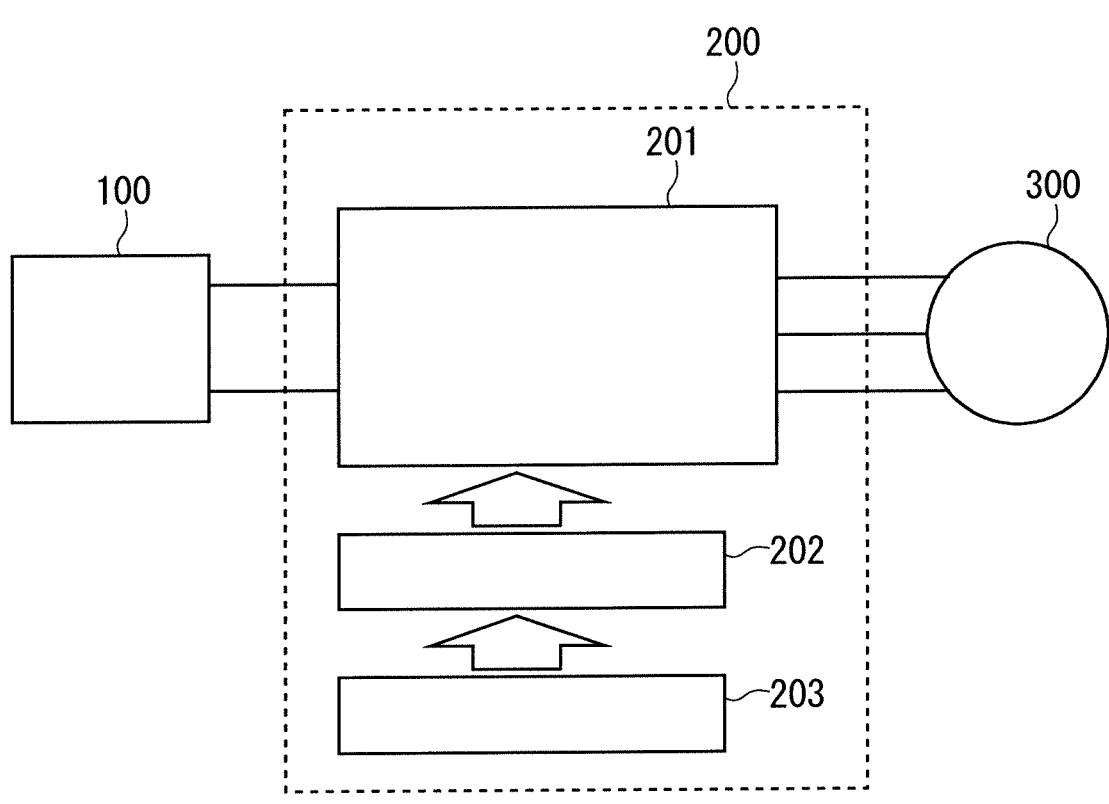

SEMICONDUCTOR DEVICE AND POWER CONVERSION APPARATUS

BACKGROUND OF THE INVENTION

Field of the Invention

The present disclosure relates to a semiconductor device and a power conversion apparatus.

Description of the Background Art

In power electronics, insulated gate-type semiconductor devices such as insulated gate bipolar transistors (IGBTs) and metal oxide semiconductor field effect transistors (MOSFETs) have widely been used as a switching element for controlling power supply to a load such as a motor.

Meanwhile, MOSFETs, IGBTs, and the like containing a wide band gap semiconductor such as silicon carbide (SiC) have attracted attention as a next generation switching element. It has been expected to apply these components to the technical field that handles high voltages equal to or more than about 1 kV. Examples of the wide band gap semiconductor include, in addition to SiC, a gallium nitride (GaN)-based material, diamond, and the like.

MOSFETs include resistance components such as a channel resistance which is a resistance component of an inversion layer called a channel, a drift resistance which is a resistance component of a drift layer, and a contact resistance between a semiconductor layer and a metal electrode as a main electrode. In addition, MOSFETs are roughly divided into a planar type and a trench type. In the planar type, a gate structure is disposed on a surface of a semiconductor layer. In the trench type, a gate structure is disposed in a trench formed in a semiconductor layer. The trench type is typically capable of achieving higher channel density than the planar type, and is therefore capable of further reducing a channel resistance.

In the trench type, however, an electric field concentrates at a bottom of a trench in which a gate structure is formed. As a result, there is a problem that the reliability of a gate oxide film is likely to be lowered. In order to solve this problem, a technique has been proposed, which relieves an electric field applied to a bottom of a trench in such a manner that a p-type electric field relieving layer is provided on the bottom of the trench to allow a depletion layer to extend the bottom of the trench. Moreover, grounding the electric field relieving layer accelerates displacement of the depletion layer during switching, which also reduces a switching loss.

When a gate voltage is applied to a gate structure, an inversion layer (channel) is formed only on a surface portion of a semiconductor layer facing the gate structure. Consequently, in a trench type MOSFET, inversion layers are formed only on surface portions of both side surfaces of a mesa-shaped semiconductor region (hereinafter, referred to as a "mesa region") sandwiched between two trenches each having a gate structure. Reducing a width of the mesa region such that the inversion layers on the side surfaces are connected to each other enables formation of the inversion layer in the entire mesa region, which further reduces a channel resistance. This structure in which the mesa region is narrowed so that the inversion layer is formed in the entire mesa region is called a "narrow mesa structure".

On the other hand, a drift layer is a semiconductor region provided between a position where an inversion layer is formed and a semiconductor substrate, and a withstand voltage of a MOSFET is held as a whole by depletion of the drift layer. A structure called a super junction is a technique for reducing a drift resistance. In the super junction, a p-type pillar layer and an n-type pillar layer are alternately arranged. The p-type pillar layer is a p-type semiconductor region extending in a vertical direction, and the n-type pillar layer is an n-type semiconductor region extending in the vertical direction. The super junction structure is capable of holding a withstand voltage by a depletion layer extending between the p-type pillar layer and the n-type pillar layer, and is also capable of reducing a drift resistance since the n-type pillar layer can be designed to have high impurity concentration.

A channel resistance and a drift resistance can be reduced by applying both the trench type structure and the super junction structure, so that a resistance of a MOSFET can be reduced. For example, Japanese Patent Application Laid-Open No. 2008-66708 discloses a semiconductor device to which both a trench type structure and a super junction structure are applied. In addition, Japanese Patent Application Laid-Open No. 2021-27138 discloses a silicon carbide semiconductor device in which an electric field relieving layer is provided immediately below a trench having a gate structure and a p-type pillar layer having a super junction structure is disposed immediately below the electric field relieving layer.

As described above, a resistance of a semiconductor device can be reduced by combining the trench type structure with the super junction structure. In consideration of processing technology in manufacturing a semiconductor device, however, a trench is narrowed only within a limited range although a mesa region can be narrowed. In a semiconductor device having a narrow mesa structure, therefore, a ratio of trenches is larger than a ratio of mesa regions. It has been recognized in this case that, when p-type pillar layers are disposed immediately below all trenches, a ratio between the p-type pillar layers and n-type pillar layers deviates from an ideal ratio, and a resistance-withstand voltage relationship of a semiconductor device becomes deteriorated.

SUMMARY

An object of the present disclosure is to provide a semiconductor device capable of preventing deterioration in a resistance-withstand voltage relationship even when a narrow mesa structure is combined with a super junction structure.

A semiconductor device according to the present disclosure is formed using a semiconductor substrate having a first main surface and a second main surface on an opposite side of the first main surface. A drift layer of a first conductivity type is formed between the first main surface and the second main surface of the semiconductor substrate. A base region of a second conductivity type is formed on a first main surface-side surface portion of the semiconductor substrate. A source region of the first conductivity type is formed on a surface portion of the base region, and a region on the surface portion of the base region, where the source region is not formed is a contact region. A source electrode connected to the source region and the contact region is formed on the first main surface of the semiconductor substrate. A plurality of trenches penetrating through the source region and the base region is formed on a first main surface side of the semiconductor substrate, and a region between two of the plurality of trenches is a mesa region. The base region and the source region are provided in the mesa region. A gate electrode that faces the base region with a gate insulating film interposed between the gate electrode and the base region is formed in each trench. An electric field relieving layer of the second conductivity type is provided immediately below each trench. A super junction structure in which a first pillar layer of the second conductivity type and a second pillar layer of the first conductivity type are alternately arranged is provided between the base region and the drift layer. A width of the first pillar layer is equal to or less than a width of the electric field relieving layer.

According to the present disclosure, the width of the first pillar layer of the super junction structure is narrower than the width of the electric field relieving layer below each trench having a gate structure; therefore, a resistance-withstand voltage relationship of the semiconductor device can be favorably maintained.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a schematic view illustrating a semiconductor device according to a first preferred embodiment;

FIG. 2 is a schematic view illustrating a semiconductor device according to a second preferred embodiment;

FIG. 3 is a schematic view illustrating a semiconductor device according to a third preferred embodiment; and FIG. 4 is a block diagram illustrating a configuration of a power conversion system to which a power conversion apparatus according to a fourth preferred embodiment is applied.

DESCRIPTION OF THE PREFERRED EMBODIMENTS

First Preferred Embodiment

FIG. 1 is a schematic view illustrating a semiconductor device 101 according to a first preferred embodiment. While an example using a MOSFET as the semiconductor device 101 is given in the present disclosure, the semiconductor device 101 may be another switching element such as an IGBT. In the following description, a first conductivity type represents an n-type and a second conductivity type represents a p-type. To the contrary, the first conductivity type may represent the p-type and the second conductivity type may represent the n-type.

The semiconductor device 101 is formed using a semiconductor substrate 1 made of silicon carbide (SiC). An upper surface of the semiconductor substrate 1 of FIG. 1 is defined as a "first main surface" and a lower surface of the semiconductor substrate 1 is defined as a "second main surface". It should be noted that a material for the semiconductor substrate 1 is not limited to silicon carbide, but may be silicon (Si). The semiconductor substrate 1 may be formed of another wide band gap semiconductor such as a gallium nitride (GaN)-based material or diamond.

A drift layer 2 of the first conductivity type (n-type) is formed between the first main surface and the second main surface of the semiconductor substrate 1. A base region 3 of the second conductivity type (p-type) is formed on a first main surface-side surface portion of the semiconductor substrate 1. Source regions 4 of the first conductivity type are discretely formed on a surface portion of the base region 3, and regions on the surface portion of the base region 3, where the source regions 4 are not formed, are contact regions 31.

A source electrode 10 connected to the source regions 4 and the contact regions 31 is formed on the first main surface of the semiconductor substrate 1. In addition, a drain electrode 11 is formed on the second main surface of the semiconductor substrate 1.

A plurality of trenches 16 penetrating through the source regions 4 and the base region 3 is formed on a first main surface side of the semiconductor substrate 1. A region between two of the plurality of trenches 16 is a mesa region 15. The base region 3 and the source regions 4 described above are respectively formed in the mesa regions 15. On surfaces of the mesa regions 15, preferably, areas of the contact regions 31 are smaller than areas of the source regions 4.

A gate insulating film 5, a gate electrode 6, and an interlayer insulating film 7 are embedded in each of the trenches 16. The gate insulating film 5 is formed on a side surface and a bottom surface of the trench 16, and the gate electrode 6 is formed on the gate insulating film 5. Accordingly, the gate electrode 6 faces the base region 3 with the gate insulating film 5 interposed between the gate electrode 6 and the base region 3. The interlayer insulating film 7 covers the gate insulating film 5 and insulates the gate insulating film 5 from the source electrode 10.

In addition, electric field relieving layers 8 of the second conductivity type are formed immediately below the trenches 16. Each electric field relieving layer 8 is electrically connected to the source electrode 10 via the base region 3. In the present preferred embodiment, connection layers 9 of the second conductivity type connecting the electric field relieving layers 8 and the base region 3 are provided in parts of the mesa regions 15. The connection layers 9 are preferably disposed immediately below the contact regions 31.

A super junction structure in which first pillar layers 13 of the second conductivity type and second pillar layers 14 of the first conductivity type are alternately arranged is provided on the drift layer 2 on the semiconductor substrate 1, that is, provided between the base region 3 and the drift layer 2. It should be noted that a peak concentration of an impurity in each first pillar layer 13 is lower than that in each electric field relieving layer 8 and a peak concentration of an impurity in each second pillar layer 14 is higher than that in the drift layer 2.

In the semiconductor device 101 according to the first preferred embodiment, extending directions of the first pillar layers 13 and the second pillar layers 14 are the same as extending directions of the trenches 16 and the electric field relieving layers 8, and the first pillar layers 13 are disposed immediately below the electric field relieving layers 8. Widths of the first pillar layers 13 are equal to or less than widths of the electric field relieving layers 8. In addition, widths of the second pillar layers 14 are wider than widths of the mesa regions 15.

In addition, the semiconductor device 101 according to the first preferred embodiment employs a narrow mesa structure including the mesa regions 15 whose widths are narrowed. In the narrow mesa structure, each mesa region 15 having a narrowed width is sandwiched between two gate electrodes 6, so that an inversion layer can be formed on the entire mesa region 15. The narrow mesa structure desirably employs a configuration in which a current flows in a vertical direction of each mesa region 15 in order to minimize a current path and reduce a channel resistance. Further, the width of each mesa region 15 is desirably in a range from 0.01 μm or more to 0.2 μm or less.

Here, a method for forming the trenches 16 will be described. The trenches 16 can be formed by dry etching using an etching mask formed on the first main surface of the semiconductor substrate 1. In a case where the semiconductor substrate 1 is made of silicon, a resist mask can be used as an etching mask. In a case where the semiconductor substrate 1 is made of silicon carbide, however, a sufficient etching selectivity ratio cannot be achieved using the resist mask due to large bonding energy of the silicon carbide. In such case, a hard mask, formed by forming a silicon oxide film or the like on the entire first main surface of the semiconductor substrate 1 and processing the silicon oxide film using a resist mask, may be used as an etching mask.

Processing accuracy of the etching mask needs to be improved in order to narrow the mesa regions 15 so as to form the narrow mesa structure, but there is a limit for this. Hence, the etching mask formed by the method described above may be further processed. Specifically, the trenches 16 may be formed by dry etching using the formed etching mask thinned by isotropic etching. This method enables formation of the narrowed mesa regions 15 each having a width of 0.2 μm or less even when the semiconductor substrate 1 is made of silicon carbide.

When the semiconductor device 101 is in an ON state, the second pillar layers 14 each serve as a current path, and when the semiconductor device 101 is switched to an OFF state, a depletion layer extends from each first pillar layer 13 to the corresponding second pillar layer 14, thereby cutting off the current path. The resistance can be reduced by increasing an impurity concentration of each second pillar layer 14; therefore, a withstand voltage-drift resistance relationship can be greatly improved by providing the super junction structure on the drift layer 2.

In a depth direction of the semiconductor substrate 1, lengths of the first pillar layers 13 and the second pillar layers 14 are preferably equal to or more than a half of a length from a bottom of the drift layer 2 to bottoms of the electric field relieving layers 8. The greater a ratio of the super junction structure in a region from the bottom of the drift layer 2 to the bottoms of the electric field relieving layers 8, the greater the improvement in the resistance-withstand voltage relationship of the semiconductor device 101.

The first pillar layers 13 are electrically connected to the source electrode 10. Thus, a disposition cycle (that is, a disposition interval) of the first pillar layers 13 is desirably the same as a disposition cycle of the trenches 16. In this case, the first pillar layers 13 can be electrically connected to the source electrode 10 through the electric field relieving layers 8 below the trenches 16.

In addition, the current paths can be further shortened by disposing the first pillar layers 13 immediately below the electric field relieving layers 8, since the current paths are less likely to be formed in regions immediately below the electric field relieving layers 8. That is, the first pillar layers 13 are preferably disposed immediately below the trenches 16 and the second pillar layers 14 are preferably disposed immediately below the mesa regions 15.

It should be noted that the super junction structure including the first pillar layers 13 and the second pillar layers 14 can be formed by ion implantation with high energy or by repeating ion implantation and epitaxial growth.

In a case where a ratio of the trenches 16 is larger than a ratio of the mesa regions 15 due to restriction on processing accuracy of the mesa regions 15, for example, when the first pillar layers 13 having the same width as the trenches 16 are provided below the trenches 16 and the second pillar layers 14 having the same width as the mesa regions 15 are provided below the mesa regions 15, the ratio of the first pillar layers 13 in the super junction structure increases, so that the resistance-withstand voltage relationship becomes deteriorated. According to the present preferred embodiment, this problem is solved by narrowing the first pillar layers 13 and widening the second pillar layers 14, so that the resistance-withstand voltage relationship can be favorably maintained.

Second Preferred Embodiment

In the first preferred embodiment, the ratio between the first pillar layers 13 and the second pillar layers 14 is optimized by narrowing the widths of the first pillar layers 13. In a second preferred embodiment, another method for optimizing the ratio will be described.

FIG. 2 is a schematic view illustrating a semiconductor device 102 according to the second preferred embodiment. The semiconductor device 102 according to the second preferred embodiment is different from the semiconductor device 101 according to the first preferred embodiment in disposition cycles of first pillar layers 13 and second pillar layers 14. In the first preferred embodiment, the ratio between the disposition cycle of the first pillar layers 13 and the disposition cycle of the trenches 16 (hereinafter, also referred to as a "disposition cycle ratio") is 1:1. In the semiconductor device 102 of FIG. 2, the disposition cycle of the first pillar layers 13 is longer than a disposition cycle of trenches 16, so that a disposition cycle ratio between the first pillar layers 13 and the trenches 16 is 2:1. This case is also capable of optimizing a withstand voltage-resistance relationship.

The disposition cycle ratio between the first pillar layers 13 and the trenches 16 may be any ratio between an integer and an integer, such as 3:1 or 3:2. Although the first pillar layers 13 may be disposed immediately below mesa regions 15 depending on the disposition cycle ratio, an amount of increase in resistance caused by this disposition is negligibly small because the channel resistance is sufficiently reduced.

In the second preferred embodiment, widths of the first pillar layers 13 may be either narrower or wider than widths of electric field relieving layers 8 below the trenches 16. While the resistance may slightly increase in a case where the widths of the first pillar layers 13 are wider than the widths of the electric field relieving layers 8, the amount of increase in resistance is also negligibly small.

The semiconductor device 102 according to the second preferred embodiment is capable of improving channel density by narrowing the trenches 16, and is thus capable of further reducing the channel resistance. The method for forming the trenches 16 described in the first preferred embodiment is capable of narrowing the mesa regions 15, but is not capable of narrowing the trenches 16. In other words, according to the method for forming the trenches 16 described in the first preferred embodiment, the ratio between the mesa regions 15 and the trenches 16 can be changed; however, disposition cycles of the mesa regions 15 and the trenches 16 cannot be changed.

Hence, the second preferred embodiment may employ the following method for forming the trenches 16. First, a first hard mask is formed on a first main surface of a semiconductor substrate 1, and is subjected to patterning. Next, a second hard mask is formed on the entire first main surface of the semiconductor substrate 1, and is subjected to anisotropic etching. As a result, the second hard mask remains on a sidewall of the first hard mask. Thereafter, the first hard mask is removed by etching, so that only the second hard mask is left. Then, the trenches 16 are formed in the first main surface of the semiconductor substrate 1 by dry etching using the remained second hard mask as an etching mask. This method enables formation of the second hard mask at twice a density of the first hard mask, and therefore enables formation of the trenches 16 each having a narrow width.

It should be noted that the first hard mask and the second hard mask are desirably made of materials having high etching selectivity ratio. For example, polycrystalline silicon may be used for the first hard mask, and a silicon oxide film may be used for the second hard mask. In addition, the trenches 16 each having a narrower width can be formed by repeatedly forming the second hard mask described above and increasing the density of the hard mask to 4 times and 8 times.

While the disposition cycles of the mesa regions 15 and the trenches 16 can be reduced by using this method, there also is a limitation in processing widths of the first pillar layers 13 and the second pillar layers 14. In a case where the first pillar layers 13 and the second pillar layers 14 are formed by ion implantation with high energy, fine processing is difficult because a thick mask material is required. In a case where the first pillar layers 13 and the second pillar layers 14 are formed by combining ion implantation with epitaxial growth, the formation is affected by mask misalignment. In addition, since the implanted ions spread to some extent in an in-plane direction, it is difficult to finely process the first pillar layers 13 and the second pillar layers 14 as performed on the mesa regions 15.

According to the present preferred embodiment, the second pillar layers 14 are not necessarily disposed immediately below the mesa regions 15; therefore, the resistance-withstand voltage relationship can be favorably maintained without the restriction owing to the widths of the first pillar layers 13 and the second pillar layers 14.

Third Preferred Embodiment

FIG. 3 is a schematic view illustrating a semiconductor device 103 according to a third preferred embodiment. The semiconductor device 103 according to the third preferred embodiment is different from the semiconductor device 101 according to the first preferred embodiment or the semiconductor device 102 according to the second preferred embodiment in extending directions of first pillar layers 13 and second pillar layers 14. In the first and second preferred embodiments, the extending directions of the first pillar layers 13 and the second pillar layers 14 are the same as the extending directions of the trenches 16 and the electric field relieving layers 8. In the semiconductor device 103 of FIG. 3, the extending directions of the first pillar layers 13 and the second pillar layers 14 are different by 90 degrees from extending directions of trenches 16 and electric field relieving layers 8. That is, the extending directions of the first pillar layers 13 and the second pillar layers 14 are perpendicular to the extending directions of the trenches 16 and the electric field relieving layers 8.

The widths of the first pillar layers 13 and the second pillar layers 14 are important parameters for the super junction structure as described in the first and second preferred embodiments. Methods for improving the resistance-withstand voltage relationship by optimizing the widths and the disposition cycles of the first pillar layers 13 and the second pillar layers 14 are described in the first and second preferred embodiments; however, the widths of the first pillar layers 13 and the second pillar layers 14 cannot be designed independently of the disposition cycle of the mesa regions 15. This is because when the widths of the first pillar layers 13 and the second pillar layers 14 are designed independently of the disposition cycle of the mesa regions 15, a positional relationship between each mesa region 15 and the corresponding second pillar layer 14 varies depending on a location, which generates a local current bias. The local current bias causes local breakdown when a large current flows due to an abnormality such as a load short circuit, and therefore needs to be avoided.

Hence, in the third preferred embodiment, defining bottom surfaces of the electric field relieving layers 8 as interfaces, the extending directions of the first pillar layers 13 and the second pillar layers 14 provided below the interfaces are shifted by 90 degrees from the extending directions of the mesa regions 15 and the trenches 16 provided above the interfaces. The widths of the first pillar layers 13 and the second pillar layers 14 can thus be designed independently of the disposition cycle of the mesa regions 15. This configuration is capable of reducing restrictions on the design of the widths of the first pillar layers 13 and the second pillar layers 14, and approximates the resistance-withstand voltage relationship to an ideal relationship. It should be noted that even when the extending directions of the first pillar layers 13 and the second pillar layers 14 are shifted by 90 degrees from the extending directions of the mesa regions 15 and the trenches 16 as described in the present preferred embodiment, the first pillar layers 13 can be electrically connected to a source electrode 10 through the electric field relieving layers 8.

Fourth Preferred Embodiment

In the present preferred embodiment, the semiconductor device according to any one of the first to third preferred embodiments described above is applied to a power conversion apparatus. While the present disclosure is not limited to a specific power conversion apparatus, a case in which the present disclosure is applied to a three-phase inverter will be described below as a fourth preferred embodiment.

FIG. 4 is a block diagram illustrating a configuration of a power conversion system to which the power conversion apparatus according to the present preferred embodiment is applied.

The power conversion system illustrated in FIG. 4 includes a power supply 100, a power conversion apparatus 200, and a load 300. The power supply 100 is a DC power supply and supplies DC power to the power conversion apparatus 200. The power supply 100 may be constituted by various power supplies. For example, the power supply 100 may be constituted by a DC system, a solar cell, or a storage battery, or may be constituted by a rectifier circuit connected to an AC system or an AC/DC converter. Alternatively, the power supply 100 may be constituted by a DC/DC converter that converts DC power output from a DC system into predetermined power.

The power conversion apparatus 200 is a three-phase inverter connected between the power supply 100 and the load 300. The power conversion apparatus 200 converts the DC power supplied from the power supply 100 into AC power and supplies the AC power to the load 300. As illustrated in FIG. 4, the power conversion apparatus 200 includes a main conversion circuit 201 that converts the DC power into the AC power and outputs the AC power, a drive circuit 202 that outputs a drive signal for driving each switching element of the main conversion circuit 201, and a control circuit 203 that outputs a control signal for controlling the drive circuit 202 to the drive circuit 202.

The load 300 is a three-phase electric motor to be driven by the AC power supplied from the power conversion apparatus 200. It should be noted that the load 300 is not limited to a load for specific use. The load 300 is an electric motor mounted on various electric apparatuses. For example, the load 300 is used as an electric motor for a hybrid vehicle, an electric vehicle, a railway vehicle, an elevator, or an air conditioner.

Hereinafter, details of the power conversion apparatus 200 will be described. The main conversion circuit 201 includes a switching element (not illustrated). The main conversion circuit 201 converts the DC power supplied from the power supply 100 into the AC power by switching operation of the switching element, and supplies the AC power to the load 300. While various specific circuit configurations may be employed for the main conversion circuit 201, the main conversion circuit 201 according to the present preferred embodiment is a two-level three-phase full bridge circuit and can include six switching elements. The semiconductor device according to any one of the first to third preferred embodiments described above is applied to each switching element of the main conversion circuit 201. The six switching elements are connected in series for every two switching elements to constitute upper and lower arms, and each of the upper and lower arms constitutes each phase (U-phase, V-phase, W-phase) of the full bridge circuit. Moreover, output terminals of each of the upper and lower arms, that is, three output terminals of the main conversion circuit 201 are connected to the load 300.

The drive circuit 202 generates a drive signal for driving each switching element of the main conversion circuit 201 and supplies the drive signal to a control electrode of the switching element of the main conversion circuit 201. Specifically, a drive signal for turning on each switching element and a drive signal for turning off the switching element are output to the control electrode of the switching element, in accordance with the control signal from the control circuit 203 to be described later. When the switching element is maintained in an ON state, the drive signal is a voltage signal equal to or more than a threshold voltage of the switching element (ON signal). When the switching element is maintained in an OFF state, the drive signal is a voltage signal equal to or less than the threshold voltage of the switching element (OFF signal).

The control circuit 203 controls each switching element of the main conversion circuit 201 so that desired power is supplied to the load 300. Specifically, a time (ON time) during which each switching element of the main conversion circuit 201 is to be turned on is calculated based on power to be supplied to the load 300. For example, the main conversion circuit 201 can be controlled by PWM control that modulates the ON time of each switching element in accordance with a voltage to be output. Then, a control command (control signal) is output to the drive circuit 202 so that the ON signal is output to the switching element to be turned on and the OFF signal is output to the switching element to be turned off at each point in time. The drive circuit 202 outputs the ON signal or the OFF signal as the drive signal to the control electrode of each switching element, in accordance with this control signal.

In the power conversion apparatus according to the present preferred embodiment, the semiconductor device according to any one of the first to third preferred embodiments is applied to each switching element of the main conversion circuit 201; therefore, a resistance can be greatly reduced.

While an example applying the present disclosure to a two-level three-phase inverter is described in the present preferred embodiment, the present disclosure is not limited thereto and can be applied to various power conversion apparatuses. While a two-level power conversion apparatus is used in the present preferred embodiment, a three-level or a multi-level power conversion apparatus may be used, or the present disclosure may be applied to a single-phase inverter in a case where power is supplied to a single-phase load. In addition, the present disclosure can also be applied to a DC/DC converter or an AC/DC converter in a case where power is supplied to a DC load or the like.

In addition, the power conversion apparatus to which the present disclosure is applied is not limited to cases where the electric motor is the load as described above. For example, the power conversion apparatus can also be used as a power supply apparatus of an electric discharge processing machine, a laser beam processing machine, an induction heating cooking appliance, or a contactless power feeding system. Moreover, the power conversion apparatus can also be used as a power conditioner of a solar power generation system, a power storage system, or the like.

It should be noted that the preferred embodiments can be freely combined and appropriately modified or omitted.

Hereinafter, various aspects of the present disclosure will be collectively described as supplementary notes.

(Supplementary Note 1)

A semiconductor device including:

a semiconductor substrate having a first main surface and a second main surface on an opposite side of the first main surface;

a drift layer of a first conductivity type formed between the first main surface and the second main surface of the semiconductor substrate;

a base region of a second conductivity type formed on a first main surface-side surface portion of the semiconductor substrate;

a source region of the first conductivity type formed on a surface portion of the base region;

a contact region as a region on the surface portion of the base region, where the source region is not formed;

a source electrode formed on the first main surface of the semiconductor substrate and connected to the source region and the contact region;

a plurality of trenches formed on a first main surface side of the semiconductor substrate and penetrating through the source region and the base region;

a mesa region as a region between two of the plurality of trenches, where the base region and the source region are provided;

a gate electrode formed in each trench and faces the base region with a gate insulating film interposed between the gate electrode and the base region;

an electric field relieving layer of the second conductivity type provided immediately below each trench; and a super junction structure provided between the base region and the drift layer and including a first pillar layer of the second conductivity type and a second pillar layer of the first conductivity type that are alternately arranged, wherein a width of the first pillar layer is equal to or less than a width of the electric field relieving layer.

(Supplementary Note 2)

The semiconductor device according to supplementary note 1, wherein a width of the second pillar layer is wider than a width of the mesa region.

(Supplementary Note 3)

A semiconductor device including:

a semiconductor substrate having a first main surface and a second main surface on an opposite side of the first main surface;

a drift layer of a first conductivity type formed between the first main surface and the second main surface of the semiconductor substrate;

a base region of a second conductivity type formed on a first main surface-side surface portion of the semiconductor substrate;

a source region of the first conductivity type formed on a surface portion of the base region;

a contact region as a region on the surface portion of the base region, where the source region is not formed;

a source electrode formed on the first main surface of the semiconductor substrate and connected to the source region and the contact region;

a plurality of trenches formed on a first main surface side of the semiconductor substrate and penetrating through the source region and the base region;

a mesa region as a region between two of the plurality of trenches, where the base region and the source region are provided;

a gate electrode formed in each trench and faces the base region with a gate insulating film interposed between the gate electrode and the base region;

an electric field relieving layer of the second conductivity type provided immediately below each trench; and a super junction structure provided between the base region and the drift layer and including a first pillar layer of the second conductivity type and a second pillar layer of the first conductivity type that are alternately arranged, wherein a ratio between a disposition cycle of the first pillar layer and a disposition cycle of each trench is represented by a ratio between an integer and an integer, other than 1:1.

(Supplementary Note 4)

The semiconductor device according to any one of supplementary notes 1 to 3, wherein extending directions of the first pillar layer and the second pillar layer are equal to an extending direction of each trench, and the first pillar layer is disposed immediately below the electric field relieving layer.

(Supplementary Note 5)

The semiconductor device according to any one of supplementary notes 1 to 3, wherein extending directions of the first pillar layer and the second pillar layer are perpendicular to an extending direction of each trench.

(Supplementary Note 6)

The semiconductor device according to any one of supplementary notes 1 to 5, wherein in a depth direction of the semiconductor substrate, lengths of the first pillar layer and the second pillar layer are equal to or more than a half of a length from a bottom of the drift layer to a bottom of the electric field relieving layer.

(Supplementary Note 7)

The semiconductor device according to any one of supplementary notes 1 to 6, wherein a width of the mesa region is equal to or less than 0.2 μm.

(Supplementary Note 8)

The semiconductor device according to any one of supplementary notes 1 to 7, further including a connection layer of the second conductivity type formed immediately below the contact region in the mesa region and connecting the electric field relieving layer and the base region.

(Supplementary Note 9)

The semiconductor device according to any one of supplementary notes 1 to 8, wherein on a surface of the mesa region, an area of the contact region is smaller than an area of the source region.

(Supplementary Note 10)

The semiconductor device according to any one of supplementary notes 1 to 9, wherein the semiconductor substrate is formed of silicon carbide.

(Supplementary Note 11)

A power conversion apparatus including:

a main conversion circuit including the semiconductor device according to any one of supplementary notes 1 to 10 and configured to convert and output input power;

a drive circuit configured to output a drive signal for driving the semiconductor device, to the semiconductor device; and a control circuit configured to output a control signal for controlling the drive circuit, to the drive circuit.

While the disclosure has been shown and described in detail, the foregoing description is in all aspects illustrative and not restrictive. It is therefore understood that numerous modifications and variations can be devised.

What is claimed is:

1. A semiconductor device comprising:

a semiconductor substrate having a first main surface and a second main surface on an opposite side of the first main surface in a vertical direction;

a drift layer of a first conductivity type formed between the first main surface and the second main surface of the semiconductor substrate;

a base region of a second conductivity type formed on a first main surface-side surface portion of the semiconductor substrate;

a source region of the first conductivity type formed on a surface portion of the base region;

a contact region as a region on the surface portion of the base region, where the source region is not formed;

a source electrode formed on the first main surface of the semiconductor substrate and connected to the source region and the contact region;

a plurality of trenches formed on a first main surface side of the semiconductor substrate and penetrating through the source region and the base region;

a mesa region as a region between two of the plurality of trenches, where the base region and the source region are provided;

a gate electrode formed in each trench and facing the base region with a gate insulating film interposed between the gate electrode and the base region;

an electric field relieving layer of the second conductivity type provided immediately below each trench; and a super junction structure provided between the base region and the drift layer and including a first pillar layer of the second conductivity type and a second pillar layer of the first conductivity type that are alternately arranged, wherein a width of the first pillar layer is equal to or less than a width of the electric field relieving layer, and in a lateral direction perpendicular to the vertical direction, a width of the second pillar layer is wider than a width of the mesa region.

2. The semiconductor device according to claim 1, wherein extending directions of the first pillar layer and the second pillar layer are equal to an extending direction of each trench, and the first pillar layer is disposed immediately below the electric field relieving layer.

3. The semiconductor device according to claim 1, wherein extending directions of the first pillar layer and the second pillar layer are perpendicular to an extending direction of each trench.

4. The semiconductor device according to claim 1, wherein in a depth direction of the semiconductor substrate, lengths of the first pillar layer and the second pillar layer are equal to or more than a half of a length from a bottom of the drift layer to a bottom of the electric field relieving layer.

5. The semiconductor device according to claim 1, wherein the width of the mesa region is equal to or less than 0.2 μm.

6. The semiconductor device according to claim 1, further comprising a connection layer of the second conductivity type formed immediately below the contact region in the mesa region and connecting the electric field relieving layer and the base region.

7. The semiconductor device according to claim 1, wherein on a surface of the mesa region, an area of the contact region is smaller than an area of the source region.

8. The semiconductor device according to claim 1, wherein the semiconductor substrate is formed of silicon carbide.

9. A power conversion apparatus comprising:

a main conversion circuit including the semiconductor device according to claim 1 and configured to convert and output input power;

a drive circuit configured to output a drive signal for driving the semiconductor device, to the semiconductor device; and a control circuit configured to output a control signal for controlling the drive circuit, to the drive circuit.

10. A semiconductor device comprising:

a semiconductor substrate having a first main surface and a second main surface on an opposite side of the first main surface;

a drift layer of a first conductivity type formed between the first main surface and the second main surface of the semiconductor substrate;

a base region of a second conductivity type formed on a first main surface-side surface portion of the semiconductor substrate;

a source region of the first conductivity type formed on a surface portion of the base region;

a contact region as a region on the surface portion of the base region, where the source region is not formed;

a source electrode formed on the first main surface of the semiconductor substrate and connected to the source region and the contact region;

a plurality of trenches formed on a first main surface side of the semiconductor substrate and penetrating through the source region and the base region;

a mesa region as a region between two of the plurality of trenches, where the base region and the source region are provided;

a gate electrode formed in each trench and facing the base region with a gate insulating film interposed between the gate electrode and the base region;

an electric field relieving layer of the second conductivity type provided immediately below each trench; and a super junction structure provided between the base region and the drift layer and including a first pillar layer of the second conductivity type and a second pillar layer of the first conductivity type that are alternately arranged, wherein a ratio between a disposition cycle of the first pillar layer and a disposition cycle of each trench is represented by a ratio between an integer and an integer, other than 1:1 such that the ratio does not equal 1.

11. The semiconductor device according to claim 10, wherein extending directions of the first pillar layer and the second pillar layer are equal to an extending direction of each trench, and the first pillar layer is disposed immediately below the electric field relieving layer.

12. The semiconductor device according to claim 10, wherein extending directions of the first pillar layer and the second pillar layer are perpendicular to an extending direction of each trench.

13. The semiconductor device according to claim 10, wherein in a depth direction of the semiconductor substrate, lengths of the first pillar layer and the second pillar layer are equal to or more than a half of a length from a bottom of the drift layer to a bottom of the electric field relieving layer.

14. The semiconductor device according to claim 10, wherein a width of the mesa region is equal to or less than 0.2 μm.

15. The semiconductor device according to claim 10, further comprising a connection layer of the second conductivity type formed immediately below the contact region in the mesa region and connecting the electric field relieving layer and the base region.

16. The semiconductor device according to claim 10, wherein on a surface of the mesa region, an area of the contact region is smaller than an area of the source region.

17. The semiconductor device according to claim 10, wherein the semiconductor substrate is formed of silicon carbide.

18. A power conversion apparatus comprising:

a main conversion circuit including the semiconductor device according to claim 10 and configured to convert and output input power;

a drive circuit configured to output a drive signal for driving the semiconductor device, to the semiconductor device; and a control circuit configured to output a control signal for controlling the drive circuit, to the drive circuit.

\* \* \* \* \*